United States Patent [19]

Harada et al.

[11] Patent Number: 4,913,090

[45] Date of Patent: Apr. 3, 1990

[54] CHEMICAL VAPOR DEPOSITION APPARATUS HAVING COOLING HEADS ADJACENT TO GAS DISPERSING HEADS IN A SINGLE CHAMBER

[75] Inventors: Shigeru Harada; Masanori Obata; Eisuke Tanaka; Kenji Kishibe, all of Itami, Japan

[73] Assignee: Mitsubishi Denki Kabushiki Kaisha, Japan

[21] Appl. No.: 246,742

[22] Filed: Sep. 20, 1988

[30] Foreign Application Priority Data

Oct. 2, 1987 [JP] Japan .................................. 62-250356

[51] Int. Cl.$^4$ ............................................. C23C 16/44
[52] U.S. Cl. .................................... 118/724; 118/718; 118/719; 118/725; 427/398.4
[58] Field of Search ............... 118/718, 719, 724, 725, 118/729, 733; 427/398.4

[56] References Cited

U.S. PATENT DOCUMENTS

| | | | |
|---|---|---|---|
| 3,785,853 | 1/1974 | Kirkman et al. | 118/500 |
| 4,423,701 | 1/1984 | Nath et al. | 118/723 |
| 4,664,951 | 5/1987 | Doehler | 118/719 |
| 4,803,947 | 2/1989 | Ueki et al. | 118/719 |

FOREIGN PATENT DOCUMENTS 2119406  11/1983  United Kingdom ................ 118/719

OTHER PUBLICATIONS

Amick et al., "Deposition Techniques . . . Semiconductor Devices", J. Vac. Sci. Technol., vol. 4, No. 5, 9–10/1977, pp. 1053–1063.

Primary Examiner—Richard Bueker
Assistant Examiner—Terry J. Owens
Attorney, Agent, or Firm—Leydig, Voit & Mayer

[57] ABSTRACT

A single chamber apparatus for chemical vapor deposition of films on semiconductor substrates transported through the chamber. Heaters and a plurality of gas dispersing heads are disposed in the chamber for forming films by chemical vapor deposition. A cooling head is disposed between each adjacent pair of gas dispersing heads for cooling whereby the surface temperature of the substrates opposite the gas dispersing heads is substantially equal to that of the substrates located opposite the cooling heads.

5 Claims, 4 Drawing Sheets

TRAY CONVEYANCE DIRECTION

CHEMICAL VAPOR DEPOSITION APPARATUS HAVING COOLING HEADS ADJACENT TO GAS DISPERSING HEADS IN A SINGLE CHAMBER

BACKGROUND OF THE INVENTION

1. Field of the Invention:

The present invention relates to an apparatus for chemical vapor deposition, and more particularly to an apparatus for chemical vapor deposition for forming films on surfaces of semiconductor substrates placed along a conveying path through chemical vapor deposition reaction.

2. Description of the Related Art:

FIG. 1A is a schematic diagram of a conventional apparatus for chemical vapor deposition (hereafter referred to as the atmospheric pressure CVD apparatus) for forming thin films under atmospheric pressure. In FIG. 1A, semiconductor substrates, e.g. silicon wafers 2, are placed on conveying trays 1 and are conveyed by conveying means 30. The conveying means 30 comprises a tray conveyance driving section 3 and a tray conveying chain 4 and to conveying the silicon wafers 2 in the direction of the arrow 5. A preheater 6, a main heater 7, and a postheater 8 are disposed consecutively in the direction of conveyance of the silicon wafers 2 below the wafer conveying trays 1. Gas dispersing heads 9 for blowing a reaction gas for causing a chemical vapor deposition reaction onto the silicon wafers 2 disposed immediately therebelow are provided above the wafer conveying trays 1. A reaction gas 10 is introduced into the gas dispersing heads 9.

A description will now be given of a case in which boro-silicate glass films (hereafter referred to as the BSG films) are formed on the silicon wafers 2 as the semiconductor substrates by using this atmospheric CVD apparatus. Incidentally, the BSG films are used as interlayer insulating films for semiconductor devices.

First, the silicon wafers 2 are placed on the wafer conveying trays 1. The wafer conveying trays 1 are then conveyed in the direction of the arrow 5 by the conveying means 30 composed of the tray conveyance driving section 3 and the tray conveying chain 4. A preheater 6, a main heater 7, and a postheater 8 are provided in a central portion of the atmospheric pressure CVD apparatus as heating means for a thermal chemical vapor deposition reaction to take place. These heaters are provided to make uniform the temperature distribution in film forming regions of the silicon wafers 2 and are so arranged to control each of the regions independently. When BSG films are formed, the heating temperature for the silicon wafers is preferably 330°–450° C. The preheater 6 is used to preheat the wafer conveying trays 1 and the silicon wafers 2 to the vicinity of a desired temperature for forming films and serves to stabilize the film forming temperature in the region of the main heater 7. In addition, the postheater 8 serves to gradually cool the wafer conveying trays 1 and the silicon wafers 2 after the film formation. A reaction gas 10, which consists of $SiH_4$, $B_2H_6$, or $O_2$ diluted by an inert gas such as $N_2$, for forming BSG films, as well as $N_2$ as a carrier gas, is introduced into the gas dispersing heads 9 provided above the main heaters 7 so as to form BSG films. After these component gases are mixed in the gas dispersing heads 9, they are blown onto the heated silicon wafers 2 placed on the wafer conveying trays 1 as a reaction gas 11.

Consequently, thermal chemical vapor reaction takes place on the surfaces of the silicon wafers 2, as shown below, and Si oxide films containing $B_2O_3$, i.e., BSG films, are formed on the surfaces of the silicon wafers 2.

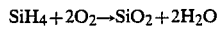

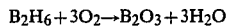

In FIG. 1A, a plurality of gas dispersing heads 9 are used. The length (denoted by reference numeral 12 in FIG. 1B) of the gas dispersing head 9 in the direction 5 of conveyance of the trays cannot be made very large to ensure that the mixed reaction gas 11 will flow uniformly onto the silicon wafers 2. For this reason, individual regions 12 for film formation are relatively short. Accordingly, since a thermal chemical vapor reaction takes place, as shown in the above formulae, if the film forming temperature and the amount of the reaction gas supplied are fixed, the fact that the film forming regions 12 are short means that the film formation rate cannot be increased. For that reason, as shown in FIG. 1A, the plurality of gas dispersing heads 9 (two in the case of FIG. 1A) are provided to substantially improve the film formation rate.

Since the conventional atmospheric pressure CVD apparatus is arranged as described above, when the reaction gas 11 is not allowed to flow from the gas dispersing heads 9, the distribution of the surface temperature of the silicon wafers can be made uniform in the vicinity of the film forming regions 12, as shown by the broken line 13 in FIG. 1B, by controlling the three heaters 6, 7, 8. Incidentally, FIG. 1B illustrates the relationships between a distance of the atmospheric pressure CVD apparatus shown in FIG. 1B in the direction of conveyance of the trays and the surface temperature of the wafers 2. However, since the reaction gas 11 is allowed to flow from the gas dispersing heads 9 toward the silicon wafers 2, the gas in an amount exceeding 10 l/min is blown locally onto the surfaces of the silicon wafers 2. Consequently, the surfaces of the silicon wafers 2 are cooled, and the temperature of the silicon wafers 2 immediately below the gas dispersing heads 9 becomes low. For instance, when the flow rate of the reaction gas 11 is 20 l/min, the surface temperature of the silicon wafers 2 immediately below the gas dispersing heads 9 drops by as much as about 20° C. For this reason, this presents a problem when the quality of the films such as the BSG films are substantially affected by the film formation temperature. Namely, the density of boron in the BSG films varies substantially depending on the film formation temperature, and when the film formation temperature is high, the density of boron in the films tends to decline. This is attributable to the fact that $B_2H_6$ contained in the mixed reaction gas 11 injected from the gas dispersing heads 9 reacts with $O_2$ in the vapor, so that the amount of $B_2H_6$ reaching the vicinity of the silicon wafers 2 is reduced as a result. Consequently, the thickness-wise distribution of the boron density in the BSG films formed by the conventional atmospheric pressure CVD apparatus shown in FIG. 1A has two bumps, as shown in FIG. 2A. FIG. 2B is a cross-sectional view of a silicon wafer 51 on which a BSG film 56 has been formed, while FIG. 2A is a graph illustrating the distribution of the boron density along the line A-A' in the thickness-wise direction of the BSG film 56 shown in FIG. 2B. Thus, the BSG film whose distribution of the boron density in the thickness-wise direction is not uniform often presents a problem when contact holes or the like are to be provided by wet etching.

FIGS. 3A and 3B are enlarged partly cross-sectional views of silicon wafers to illustrate this problem. The etching rate of the BSG films in a hydrofluoric acid-based solution depends on the boron density, and a higher boron density results in a lower etching rate. For this reason, when the distribution of the boron density in the thickness-wise direction of the BSG film 56 is uniform, if etching is performed with a hydrofluoric acid using a photoresist 54 as a mask, an isotropic etching configuration 55 is obtained, as shown in FIG. 3A. However, in the case of the BSG film 56 having the two bumps, as shown in FIG. 2A, since the etching rate with respect to the hydrofluoric acid-based solution in the thickness-wise direction is not constant, an abnormal configuration 57 is obtained due to etching, as shown in FIG. 3B. Consequently, when a metal wiring 58 is formed on the portion having this abnormal configuration 57 after removal of the photoresist 54, a discontinuity may result (at the portion indicated by reference numeral 59), and the step coverage of this portion is poor.

SUMMARY OF THE INVENTION

Accordingly, an object of the present invention is to provide an atmospheric pressure CVD apparatus which is capable of forming thin films with uniform film quality in the thickness-wise direction thereof, thereby overcoming the above-described drawbacks of the conventional art.

To this end, according to the present invention, there is provided an apparatus for chemical vapor deposition in which semiconductor substrates are placed in a conveying path to form films on the surfaces of the semiconductor substrates through chemical vapor deposition reaction, the apparatus comprising: conveying means for conveying the substrates; heating means which is disposed below the substrates conveyed by the conveying means for heating the substrates; a plurality of gas dispersing heads which are disposed above the substrates located in the conveying path and for blowing a gas, containing a reaction gas for forming films on the substrate surfaces through chemical vapor deposition reaction, onto the substrates located immediately therebelow; at least one cooling head which is disposed between the gas dispersing heads and for cooling the substrates by blowing a cooling gas which does not cause chemical vapor deposition reaction onto the substrates located immediately therebelow, in such a manner that a surface temperature of the substrates located immediately below the gas dispersing heads becomes substantially identical with that of the substrates located immediately below the cooling head.

In this invention, the surface temperature of the semiconductor substrates disposed immediately below the cooling heads can be reduced in such a manner as to become substantially identical with the surface temperature of the semiconductor substrates disposed immediately below the gas dispersing heads by adjusting the amount of cooling gas flowing from the cooling heads. For this reason, the temperature distribution in film forming regions can be made uniform. Consequently, even when thin films that are substantially affected by the film formation temperature are to be formed, it is possible to form thin films whose film quality in the thickness-wise direction thereof is uniform, such as those in which the distribution of the boron density is uniform.

DESCRIPTION OF THE PREFERRED EMBODIMENT

Referring now to the accompanying drawings, a description will be given of an embodiment of the present invention.

Figure 5A:
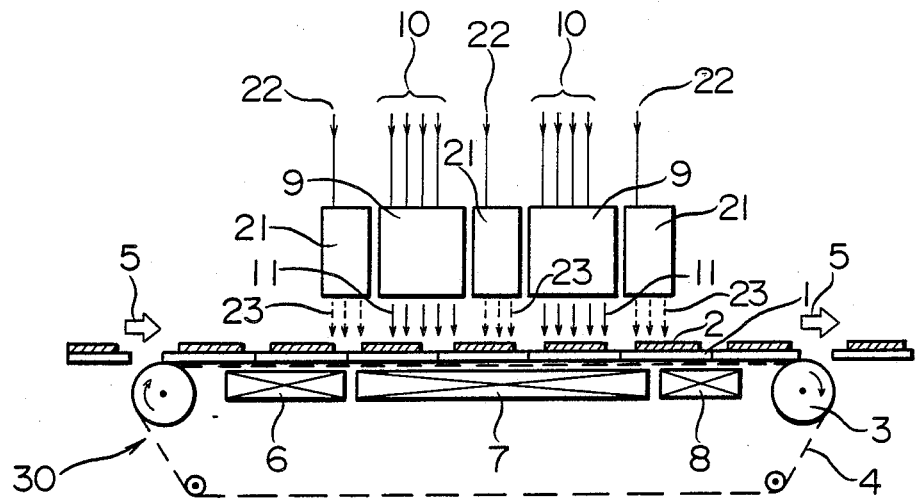
FIG. 5A is a schematic diagram of a chemical vapor deposition apparatus in accordance with an embodiment of the present invention.
Figure 5B:
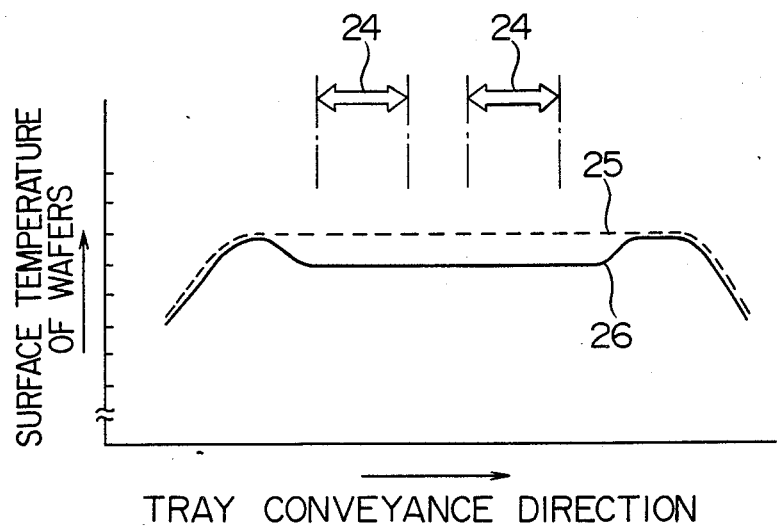
FIG. 5B is a graph illustrating the relationship between a distance in the conveyance of trays and the surface temperature of wafers in the apparatus shown in FIG. 5A.

FIG. 5A is a schematic diagram illustrating an embodiment apparatus according to the present invention, while FIG. 5B is a graph illustrating the relationships between a direction of conveyance of trays and the surface temperature of wafers when that apparatus is used.

Figure 1A:
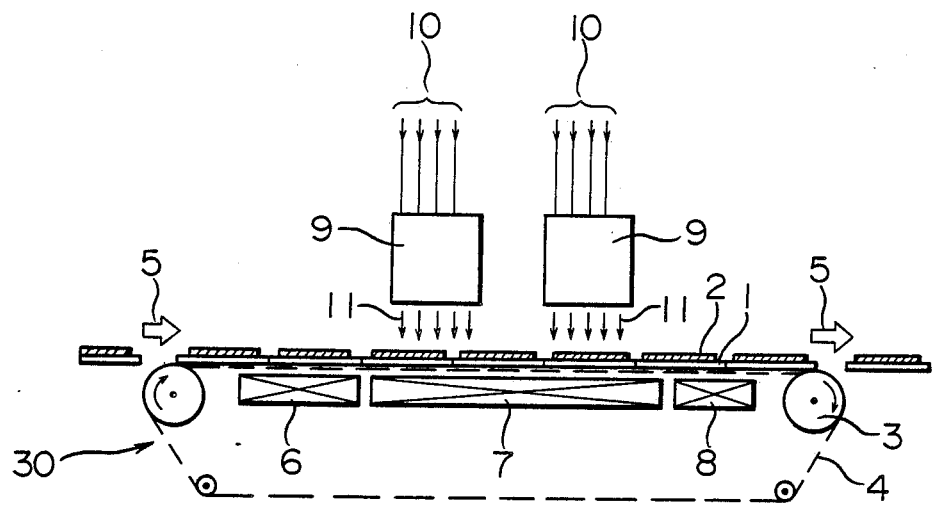
FIG. 1A is a schematic diagram of a conventional atmospheric pressure CVD apparatus.
Figure 1B:
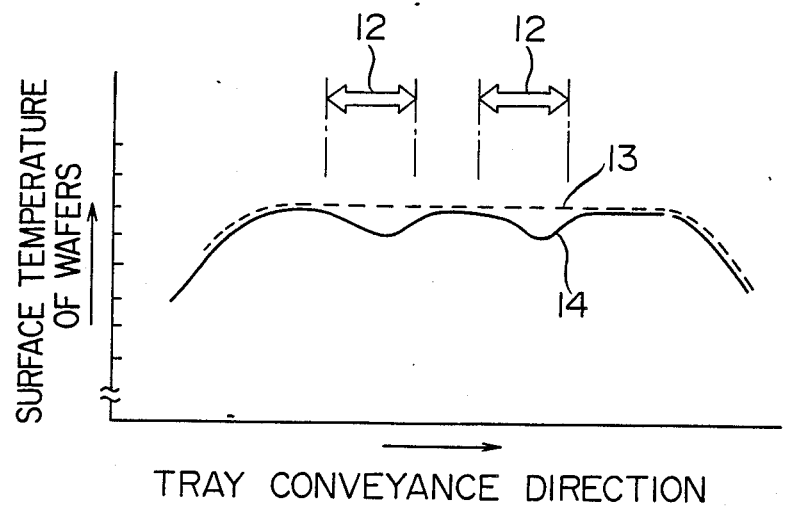
FIG 1B is a graph illustrating the relationships between a distance in the direction of conveyance of trays and the surface temperature of wafers in the conventional apparatus.
Figure 2A:
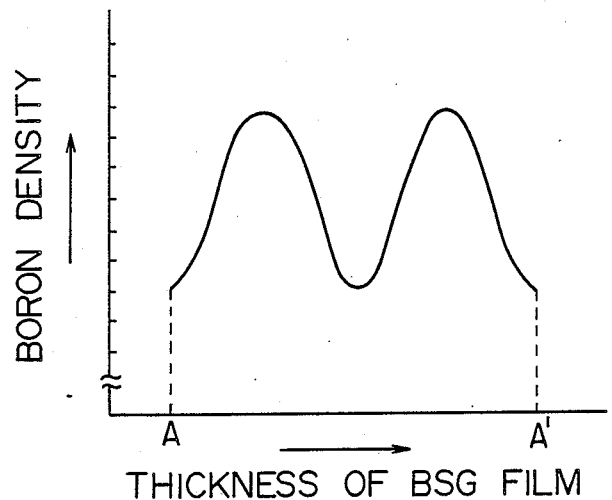
FIG. 2A is a graph illustrating the thickness-wise distribution of the boron density in a BSG film.
Figure 2B:
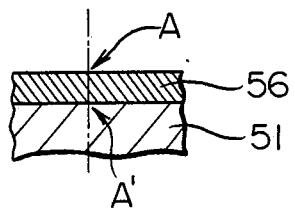
FIG. 2B is a cross-sectional view of a silicon wafer with the BSG film formed thereon.
Figure 3A:
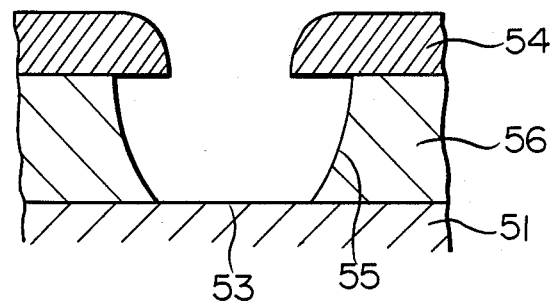
FIGS. 3A and 3B are enlarged partly cross-sectional views of silicon wafers obtained after different BSG films are subjected to etching.
Figure 3B:
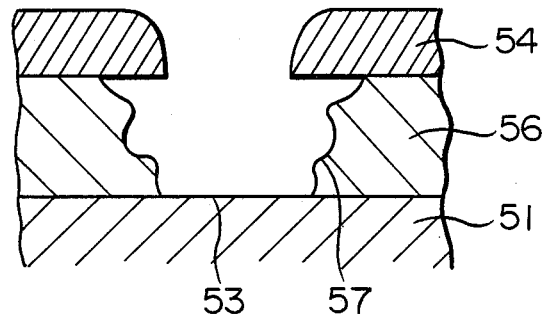

In FIG. 5A, the same reference numerals as those in FIG. 1A denote the same or corresponding parts. An apparatus for chemical vapor deposition in accordance with the present invention comprises: conveying means 30 for conveying semiconductor substrates, e.g. silicon wafers 2; heating means which is disposed below a path for conveying the silicon wafers 2 conveyed by the conveying means and for heating, the silicon wafers 2, the heating means including, for instance, a preheater 6, a main heater 7, and a postheater 8; a plurality of gas dispersing heads 9 which are disposed above the silicon wafers 2 located in the conveying path and for blowing a gas 10, including a reaction gas for forming films on the surfaces of the silicon wafers 2 through chemical vapor reaction, onto the silicon wafers 2 disposed immediately therebelow; and at least one cooling head 21 which is disposed between the gas dispersing heads 9 and is for cooling the silicon wafers 2 by blowing a cooling gas 23, which will not cause chemical vapor reaction, onto the silicon wafers 2 located immediately therebelow in such a manner that the surface temperature of the silicon wafers 2 located immediately below the gas dispersing heads 9 will become substantially identical with the surface temperature of the silicon wafers 2 located immediately below the cooling head 21.

Figure 4:
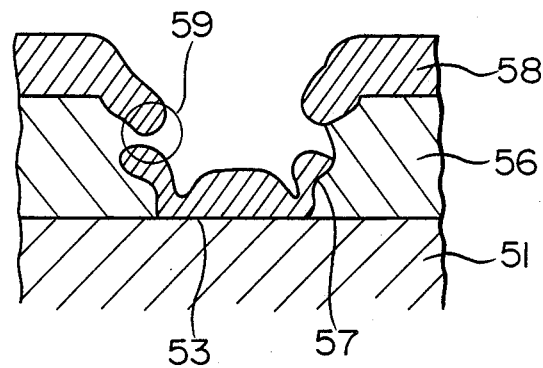
FIG. 4 is an enlarged partly cross-sectional view of a silicon wafer, illustrating a defect occurring when a BSG film whose thickness-wise distribution of the boron density is not uniform is used.

In a conventional apparatus, the surfaces of the silicon wafers 2 are cooled by the reaction gas 11 injected from the gas dispersing heads 9. As a result, the surface temperature of the silicon wafers 2 located immediately below the gas dispersing heads 9 becomes low, so that there has been the problem that the temperature in the film forming regions 12 does not become constant. In the apparatus for chemical vapor deposition in accordance with the present invention, this problem is solved. For instance, $N_2$ gas is introduced into cooling heads 22 as a cooling gas, and a cooling gas 23 is blown onto the surfaces of the silicon wafers 2 by injecting the same. At this time, if the flow rate of the cooling gas 23 injected from the cooling heads 21 is made substantially identical with that of the reaction gas 11 injected from the gas dispersing heads 9, the silicon wafers 2 in film forming regions 24 are cooled uniformly by the gases. Accordingly, the surface temperature of the wafers 2 exhibits a temperature distribution such as the one indicated the solid line 26 in FIG. 5B, and the surface temperature of the silicon wafers 2 in the film forming regions 24 can be made uniform. Therefore, even when the film quality, particularly the density of boron in the films, would be substantially affected by the film forming temperature, it is possible to obtain thin films whose thickness-wise film quality is uniform. Hence, it is possible to prevent defects from occurring due to the nonuniformity of the film quality in the direction of the thickness, e.g., the boron density, as shown in FIG. 4.

Although in the foregoing embodiment a description has been given of an example in which the $N_2$ gas is used as the cooling gas 23 introduced into the cooling heads 21, the present invention is not restricted to the same, and a similar effect can be realized if an inert gas such as He, Ne, Ar, Kr, or Xe, $H_2$, $O_2$, $N_2O$, or $CO_2$, or a gas containing these gases, is used. However, since the specific heat differs for each gas, it is necessary to take the flow rate of the gas into account in order to make the cooling capacity identical with the $N_2$ gas. In other words, the flow rate of the gas can be decreased when a gas having a large specific heat is used, while the flow rate of the gas must be increased when the specific heat is small.

In addition, although in the foregoing embodiment a description has been illustrated of an example in which two gas dispersing heads 9 and three cooling heads 21 are used, the numbers thereof may be altered, as necessary.

What is claimed is:

1. An apparatus for depositing a film on a moving substrate comprising:
   a single chamber in which a film may be deposited in successive layers on a surface of a substrate by successive chemical vapor depositions;
   means for conveying a plurality of substrates through said single chamber during deposition of layers on the substrates;
   means for heating the substrates in said single chamber during deposition of the layers and conveying of the substrates;
   a plurality of spaced-apart gas dispersing heads disposed in said single chamber for respectively supplying reaction gases to the surface of a substrate being conveyed through said single chamber for deposition of the respective layers of the film on the surface by chemical vapor deposition; and
   a cooling head disposed between each adjacent pair of said spaced-apart gas dispersing heads in said single chamber for supplying a non-reactive cooling gas to the surface of a substrate being conveyed through said single chamber to maintain the temperature of the substrate substantially constant between each adjacent pair of gas dispersing heads.

2. An apparatus for chemical vapor deposition according to claim 1 wherein said cooling gas is an inert gas selected from or a gas mixture including an inert gas selected from the group consisting of helium, neon, argon, krypton, and xenon.

3. An apparatus for chemical vapor deposition according to claim 1 wherein said cooling gas is a gas selected from or a gas mixture including an inert gas selected from the group consisting of nitrogen, hydrogen, oxygen, carbon dioxide, and nitrogen suboxide.

4. An apparatus for chemical vapor deposition according to claim 1 wherein said semiconductor substrate is a silicon wafer.

5. An apparatus for chemical vapor deposition according to claim 1 wherein said film is a boro-silicate glass film.

* * * * *